(12) United States Patent
Hancock et al.

(10) Patent No.: US 6,271,866 B1
(45) Date of Patent: Aug. 7, 2001

(54) DUAL PORT MEMORY SYSTEM FOR BUFFERING ASYNCHRONOUS INPUT TO A RASTER SCANNED DISPLAY

(75) Inventors: William Ray Hancock, Phoenix; Robert John Quirk, Glendale, both of AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/219,959

(22) Filed: Dec. 23, 1998

(51) Int. Cl.[7] .................................................. G06F 13/16
(52) U.S. Cl. .......................... 345/544; 345/531; 345/565; 348/715; 348/718
(58) Field of Search ..................................... 345/503, 531, 345/544, 547, 554, 565; 348/715, 718, 719

(56) References Cited

U.S. PATENT DOCUMENTS

| | | |
|---|---|---|
| 5,130,979 | 7/1992 | Ohtawa ................................. 370/374 |
| 5,914,711 * | 6/1999 | Mangerson et al. .................. 345/203 |
| 5,949,439 * | 9/1999 | Ben-Yoseph et al. ................ 345/503 |
| 5,982,397 * | 11/1999 | Walsh .................................... 345/521 |
| 6,012,109 * | 1/2000 | Schultz .................................... 710/56 |

* cited by examiner

Primary Examiner—Ulka J. Chauhan

(57) ABSTRACT

A system which utilizes dual-port memory to seamlessly display video frames on a raster scanned display device. Dual port memory is partitioned into a 'single frame buffer' having sufficient capacity to buffer a full video frame, and an 'extension buffer' which is a contiguous extension of the single frame buffer. The two sections together comprise an 'extended buffer'. As long as the video memory write and read addresses are sufficiently separated by a predetermined number of lines, video data is written and read using the single frame buffer for each frame. When the write and read addresses are closer than a predetermined number of lines, the incoming video data for the next several new frames is written using the 'extended' buffer, and also read therefrom. After the write and read addresses are again sufficiently separated, video data is written and read using only the single frame buffer.

20 Claims, 5 Drawing Sheets

DUAL PORT MEMORY SYSTEM FOR BUFFERING ASYNCHRONOUS INPUT TO A RASTER SCANNED DISPLAY

FIELD OF THE INVENTION

This system relates generally to memory for raster scanned displays and, in particular, to a system for controlling the reading from and writing to dual-port memory used as a buffer for asynchronous digital video data to be displayed on an LCD display.

PROBLEM

Typically, a raster scanned display is synchronized to the incoming digital video to be displayed. When digital video is received for display on a raster scanned display device asynchronously with respect to the display frame read rate, the incoming video must be buffered. The video can then be read out of the buffer synchronously with respect to the display. The types of memory schemes typically employed for this buffering are described below, including dual-port memory, 'ping-pong' memory, and 'ping-pong-pong' memory configurations.

A dual-port (RAM) memory allows the simultaneous writing and reading of data. Dual-port memories simplify many data buffering schemes in that they do not require the complex multiplexing of address and data buses needed by memory configurations such as the 'ping-pong' and 'ping-pong-pong' buffering schemes (described below). However, in a typical system which uses a raster scanned video display device, such as an LCD display, the incoming video signal is asynchronous with respect to the display frame read rate. Therefore, absent some method of compensating for the difference in the read and write rates, the write and read addresses in video display memory must eventually cross each other. This crossover will occur because the incoming video data is filling a raster scanned video frame either faster or more slowly than the video frame display rate. When such address crossover occurs, the display device will display part of the new incoming video frame and part of the last incoming video frame. When the video image contains motion, this split becomes visible on the display, since part of the screen shows a segment of the image in the prior frame, and part of the screen shows a segment of the current image, which typically has moved relative to the prior frame. If the incoming video frame rate is close to the displayed frame rate, this frame split can remain static on the display for many frames or slowly move across the screen. Such a frame split may cause the displayed image to be significantly degraded in real-time applications such as flight navigation or monitoring of other time-critical functions.

A 'ping-pong' memory allows data to be written to a 'ping' buffer while data is read from a 'pong' buffer. At the completion of each frame, the 'ping' and 'pong' buffers are swapped. One of the problems with using this system with asynchronous reads and writes is similar in effect to that of a dual-port memory configuration. Since the incoming video frame is not matched to the video display read-out, the buffer swapping will cause part of an old frame to be displayed at the same time that part of a new frame is being displayed.

Similar to the 'ping-pong' memory arrangement described above, a 'ping-pong-pong' buffering scheme allows data to be written to a 'ping' buffer while data is read from either of two 'pong' buffers. When either the write or read operations are complete for a given frame, the operations then proceed to use the idle buffer for the next frame. This prevents the write and read addresses from ever crossing. Problems with this scheme include the added expense of having three banks of full field memory, the increased circuit board area used and the difficulty of multiplexing the address and data buses between the video input and output and the three banks of memory.

SOLUTION

The present invention overcomes the foregoing problems and achieves an advance in the art by providing a system which utilizes a 'dual-port memory wrap-around' scheme to seamlessly display video frames on a raster scanned display device, while avoiding the problems of address crossover, address and data multiplexing, and added cost and circuit board area.

In accordance with the present invention, video data to be displayed on a raster scanned display is written to and read from addresses in dual-port RAM memory, hereinafter referred to simply as LCD memory. Although the present invention is described in the context of an LCD-type display, the present system is functional with other types of raster display devices, such as plasma displays, field emission displays, or analog displays, such as CRTs. LCD memory is partitioned into a 'single frame buffer' having sufficient capacity to buffer a full LCD video frame, and an 'extension buffer' which is a contiguous extension of the single frame buffer. The two sections together comprise an 'extended buffer'.

As long as the LCD memory write and read addresses are sufficiently separated by a predetermined number of lines N, video data is written and read using the single frame buffer for each frame. When the write and read addresses are closer than N lines, indicating that they are about to cross, wrap-around mode is initiated. Upon commencing wrap-around mode, the incoming video data for the next new frame is written using the 'extended' buffer, e.g., the write addresses continue to be incremented past the single frame buffer into the extension buffer. However, the video data continues to be read out only from the single frame buffer for one additional frame. When a frame write operation reaches the end of the extension buffer, the write operation for the current frame continues at the top of LCD memory. At the completion of this frame, the next frame write operation is again initiated immediately below the current frame ending. When the write location again reaches the end of the extension buffer, the writing 'wraps' back to the top of memory. After the LCD video read operation is completed for the one additional frame, the read operation uses the entire extended buffer, tracking the previous incoming video write addresses past the bottom of the last regular frame, into the extension buffer. This tracking continues for a predetermined number of frames Z, at which time the read and write addresses are compared. If, at the end of Z frames, the incoming video and LCD read-out frames are sufficiently out of synchronization, that is, if the write and read addresses are sufficiently spaced in LCD memory, the write and read operations go back to the normal single memory block mode beginning with their respective next new frame. If the write and read locations are still too close together, the above process is repeated. In this manner, the incoming video write address and the LCD video read-out address are prevented from crossing.

BRIEF DESCRIPTION OF THE DRAWING

The invention may be better understood from a reading of the following description thereof taken in conjunction with the drawing in which.

DETAILED DESCRIPTION

Definitions

For the purpose of this disclosure, the following definitions are applicable to the present invention as described and claimed:

The term 'frame' refers to the data comprising the composite of all lines to be displayed on a given video display device;

'Line' 111 is used in the sense normally associated with a row of pixels on a typical video display device;

'Single frame buffer' 351 is a field of LCD memory, the capacity of which is equal to a full LCD video frame;

'Extension buffer' 358 is the section of LCD memory which is a contiguous extension of single frame buffer 351;

'Extended buffer' 355 is the entire LCD memory, consisting of single frame buffer 351, to which extension buffer 358 is appended; and 'Write address' refers to the address in LCD memory 101 to which incoming video data is written, and the term 'read address' similarly corresponds to the memory address from which the LCD display device 110 reads the video data to be displayed.

Figure 1:
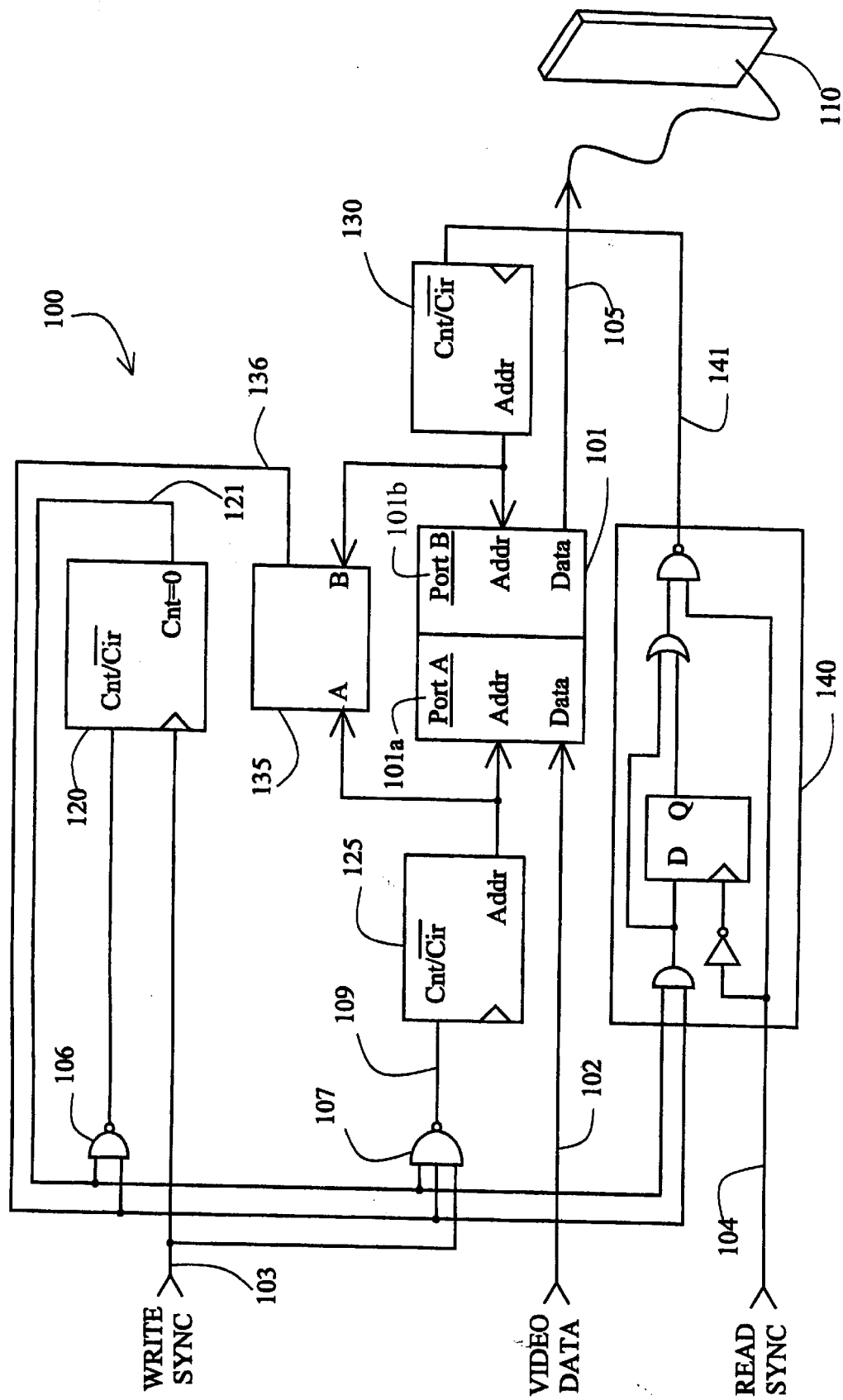
FIG. 1 is a diagram illustrating the component interconnection in one implementation of the present invention.

FIG. 1 shows one exemplary embodiment of the dual-port memory wrap-around system 100 of the present invention. The present invention functions with conventional dual-port RAM memory as well as with serial dual-port RAMs which have internal address generators and separate read/write address reset lines. Serial dual-port RAMs are also known as dual-port 'FIFO' RAMs, which function as 'first-in-first-out' buffers. Since the internal address generators of the serial dual-port RAMs are inaccessible to outside logic, external address generators are needed to decide when the serial dual-port RAM addresses are allowed to wrap around or should have their addresses reset. Both the internal address generators and the external address generators are cleared, as well as incremented, at the same time. Although system 100 is described in the context of an LCD-type display 110, it is to be understood that the present system is functional with other types of raster display devices, such as plasma displays, field emission displays, or analog displays, such as CRTs, after digital-to-analog conversion of the digital video output 105.

Figure 1A:
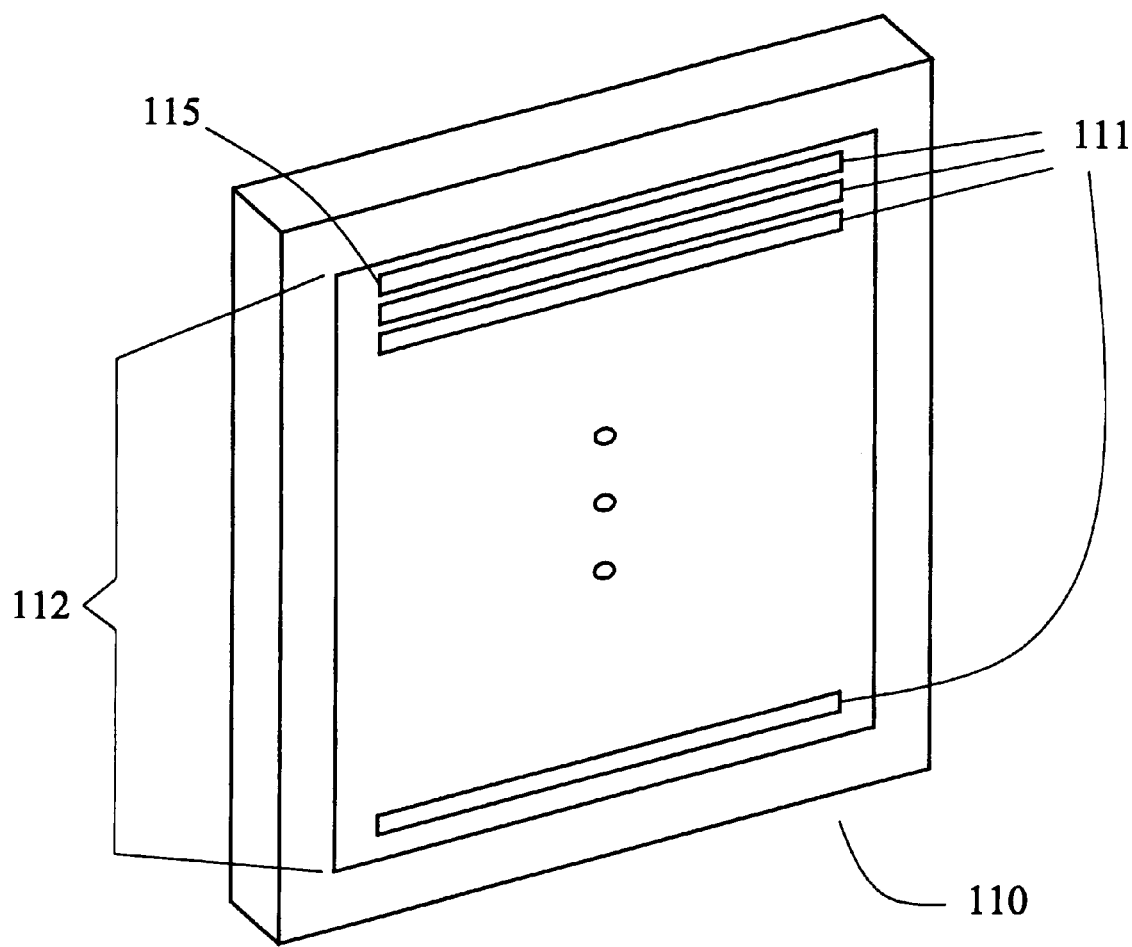
FIG. 1A is a diagram showing a frame containing lines as displayed on a video display device.
Figure 2:
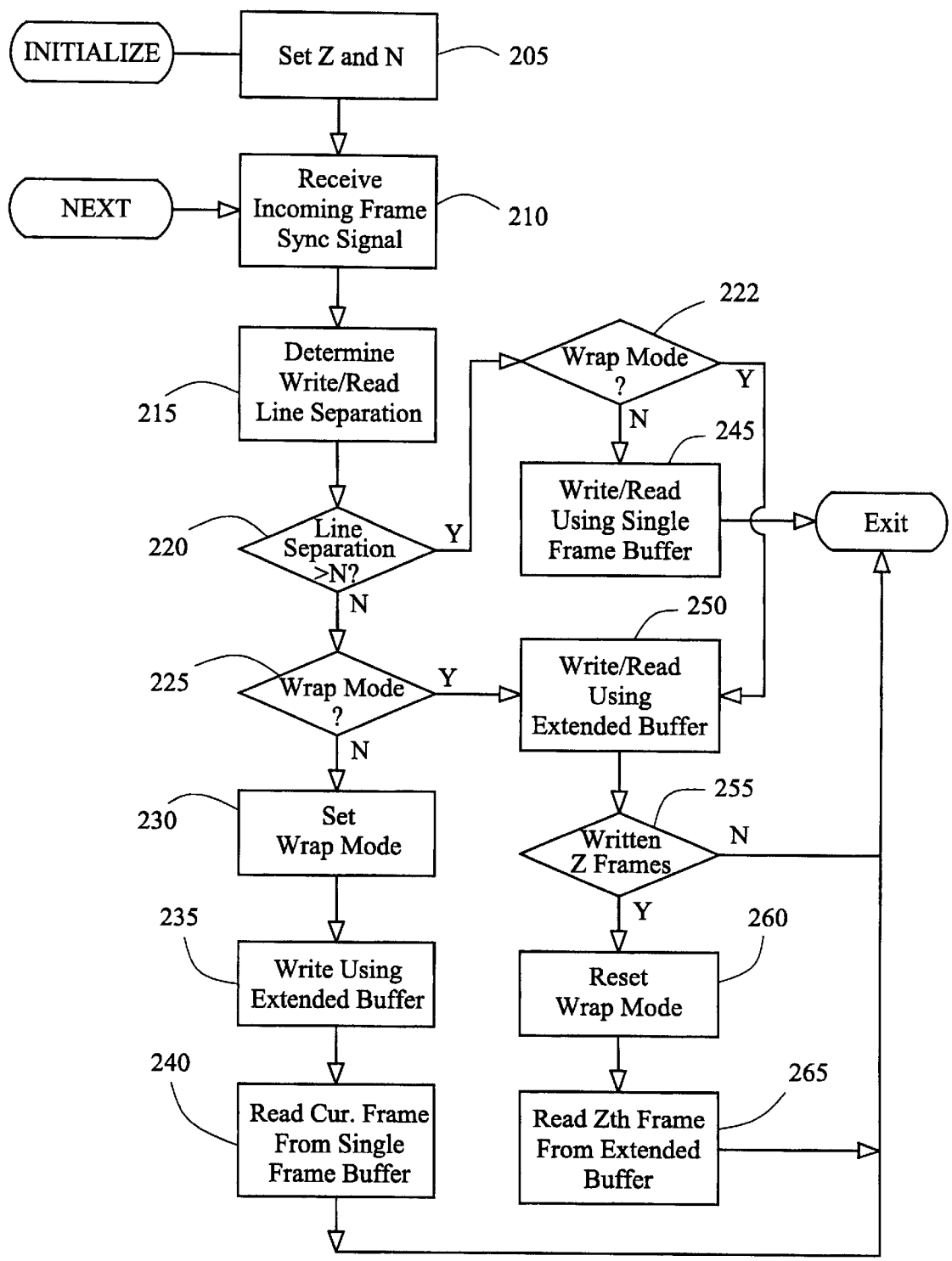
FIG. 2 is a flowchart showing the steps performed for the general case in avoiding address crossover between write and read operations.
Figure 3:
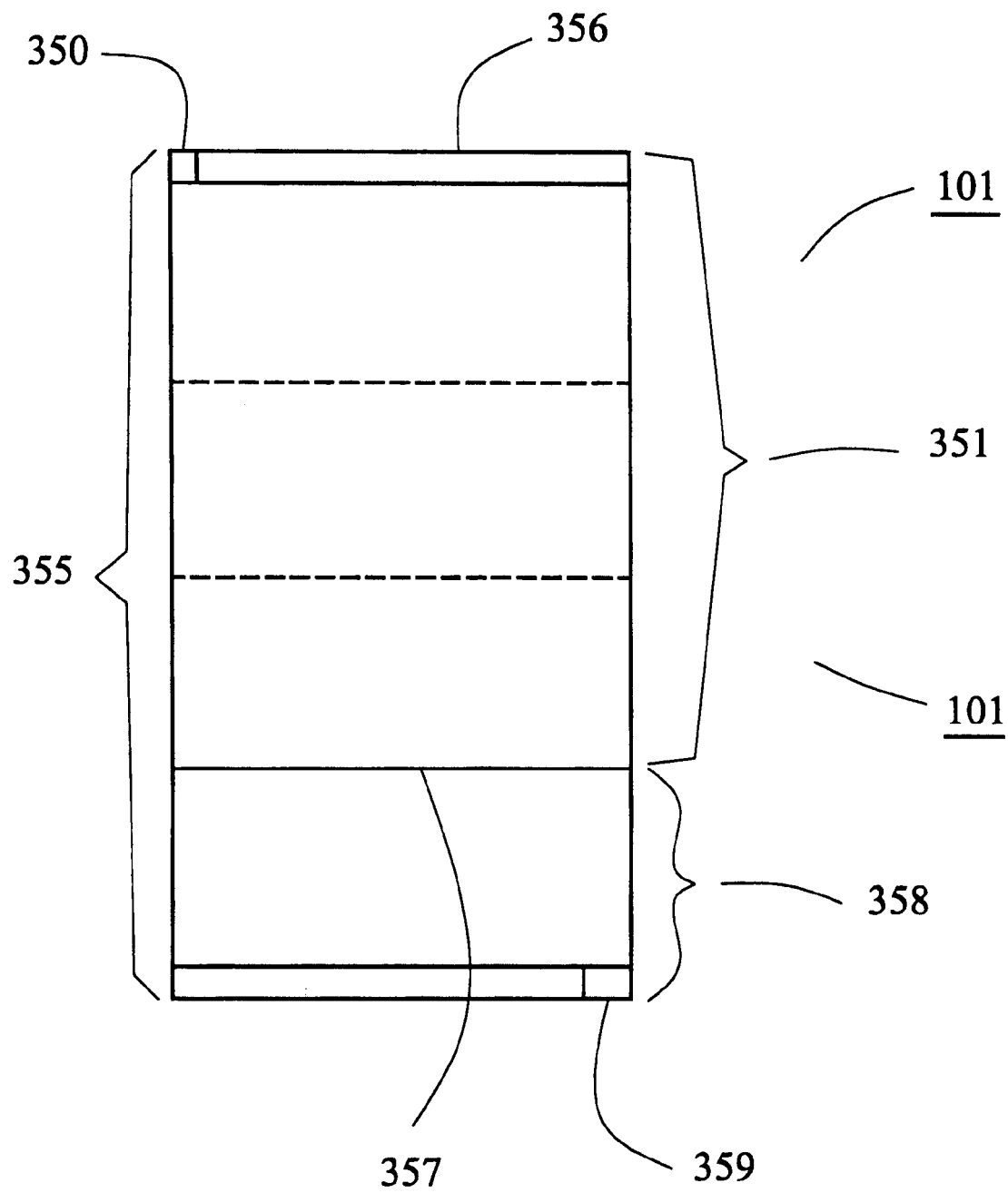
FIG. 3 shows the layout of dual-port RAM memory.

FIG. 1A is a diagram showing a frame containing lines as displayed on a video display device. FIG. 2 is a flowchart showing the steps performed by dual-port memory wrap-around system 100 in order to avoid address crossover between write and read operations. The operation of system 100 is best understood in the context of FIGS. 1, 1A, and 2, taken together. As shown in FIG. 1, incoming frame video data is received by dual port RAM memory 101 via line 102, and sent to LCD display 110 via line 105. As shown in FIG. 2, at step 205, values are set for N, the minimum line separation, and Z, the number of successive frames to be processed in wrap-around mode. At step 210, incoming frame write synchronization (hereinafter referred to as 'write sync') pulse 103 is received. Next, at step 215, the separation N between the read and write addresses is determined by address compare logic 135. Frame write address counter 125 and frame read address counter 130 supply address data to LCD memory port 'A' 101a, and memory port 'B' 101b, respectively. Write address counter 125 receives a counter reset signal on line 109 in response to write sync pulse 103 if appropriate signals are present on lines 121 and 136. That is, write sync pulse 103 resets the write address for the start of the next frame 112 to the top 356 of dual-port LCD memory 101, if signal 121 (wrap-around mode=off) and address threshold signal 136 (|write address−read address|>N) are both present at gate 107. This situation, in which write sync pulse 103 causes a reset of the write address to the top of the buffer 356, is considered to be the 'normal' mode of operation, and is referred to herein as 'single frame buffer mode'. The layout, or partitioning, of LCD memory 101 is shown in FIG. 3.

At step 220, if the write and read addresses are separated by less than a threshold number of lines N, then at step 225, it is determined whether wrap-around mode (further explained below) is presently in effect. The minimum value of threshold N is determined by taking the percentage of difference between the expected write and read rates, multiplying the total number of lines 111 in a frame 112 by this difference percentage, and rounding the result up to the next integer value. For example, if the writes are likely to occur 10 percent faster than reads (or vice-versa), and there are 512 lines (rows of pixels) per frame 112, then N should have a value of at least 52 lines (512×0.10=51.2, which rounds up to 52). If the incoming video frame 112 ends during wrap-around mode, then write sync pulse 103 is ignored.

At step 225, if the system is not presently in wrap-around mode, then at step 230, wrap-around mode is set, since the line separation is greater than the minimum distance N. When address compare logic 135 determines that the line separation is greater than N, the signal normally present on line 136 goes low, thereby inhibiting the count clear (count=0) function of wrap counter 120, and thus allowing wrap counter 120 to increment its count of the number of iterations in which wrap-around mode is in effect. At step 235, extended buffer 355 is used for the present write operation, that is, when the video write address reaches the bottom 357 of single frame buffer 351, writing continues into extension buffer 358.

In wrap-around mode, when the write address in LCD memory 101 reaches the end 359 of extension buffer 358, at an address corresponding to (Z+1)/Z frames (where Z is any integer greater than 1), the LCD write operation continues to write video data for its present field at the top of memory 356. At the completion of this frame 112, the next frame write operation is again initiated immediately below the current frame ending. When the write location again reaches the (Z+1)/Z frame address, the writing continues at the top of memory 356. After the LCD video read operation completes an additional normal frame read operation at step 240, (using single frame buffer 351 only), it then tracks the incoming video write addresses past the bottom of the last regular frame into extension buffer 358. This continues for Z frames, at which time the frame write and read addresses are compared. If the write and read addresses now sufficiently out of synchronization (i.e., separated by more than N lines), the writes and reads go back to the normal single frame buffer mode beginning with their next new respective frame. If the write and read locations are still within N lines, the above process repeats for Z more frames. In this way, the incoming video write address and the LCD read-out addresses are prevented from crossing.

The value of Z should be small to prevent the read and write locations from separating and then closing again before the single frame buffer mode can be reached. Optimal values of Z range between 2 and 5, inclusive. A value of Z=3 is ideal for XGA display resolution since it requires an even 1 megabyte of memory word locations allowing a standard 512K byte location memory to be used. In one exemplary embodiment, the present invention is utilized as a video buffer for an XGA type of LCD display having an associated memory with capacity of 1 Meg×24-bits, which allows for exactly four-thirds of a full frame of 24-bit color XGA video to be stored, making the value of Z equal to 3.

At step 220, if the write and read addresses are separated by more than the threshold number of lines N, then at step 222, a check is made to determine wrap-around mode is already set. This is because during the Zth iteration of frame writing, the write/read address separation is typically greater than N. If wrap-around mode is not set, then video writes and reads are confined to the normal single frame buffer 351. Otherwise, if wrap-around mode is in fact set, then the entire extended buffer 355 is used for writing and reading video frames 112, at step 250.

At step 225, if wrap-around mode is already in effect, then, at step 250, all frame write and read operations are performed using the entire extended buffer 355. Full field delay logic 140 receives LCD frame read synchronization (hereinafter called 'read sync') pulse 104, and clears (zeros) read address counter 130 via a counter reset signal applied to line 141, only if the previous frame's write sync signal 103 was allowed by gate 107 (as delayed by full field delay 140). This ensures that the LCD read frame operation repeats a read operation using single frame buffer 351 once and then tracks the incoming frame 110 through extension buffer 358 during wrap-around mode.

In the present embodiment, the full field delay 140 includes a D Flip Flop and basic combinational logic producing one of two results as each read sync pulse 104 is received. In the first situation, if the system is not operating in wrap mode (indicated by an output on line 121 equal to 1) and the write and read addresses were sufficiently separated (indicated by an output on line 136 equal to 1) during the prior read sync pulse, then read address counter 130 is cleared. This causes the new frame 110 to begin again at address 0 (reference no. 350 on FIG. 3).

In the second situation, if the system is operating in wrap mode (indicated by an output on line 121 equal to 1), or the write and read addresses were too close so that the wrap sequence will have started on the next write frame (indicated by an output on line 136 equal to 0 during the prior read sync pulse), then read address counter 130 is not modified, which allows the read address to continue to increment from its present location. Therefore, when a counter reset signal is not asserted on line 141 in response to a read sync pulse 104, system 100 is operating in wrap-around mode, separating reads and writes by a full frame of video data.

At step 255, wrap counter 120 increments the count of frames processed in wraparound mode. If Z frames have already been written in wrap-around mode, then, at step 260, wrap counter 120 asserts a counter reset signal on line 121, so that the next write sync pulse 103 will cause write address counter 125 to re-initialize the write address to 0, so that the following frame 112 starts at the beginning of the frame 350. At step 265, the Zth 'wrapped' frame 112 is read using the entire extended buffer 355, that is, the frame read operations track the previously written frame 112 into and through extension buffer 358.

Figure 4:
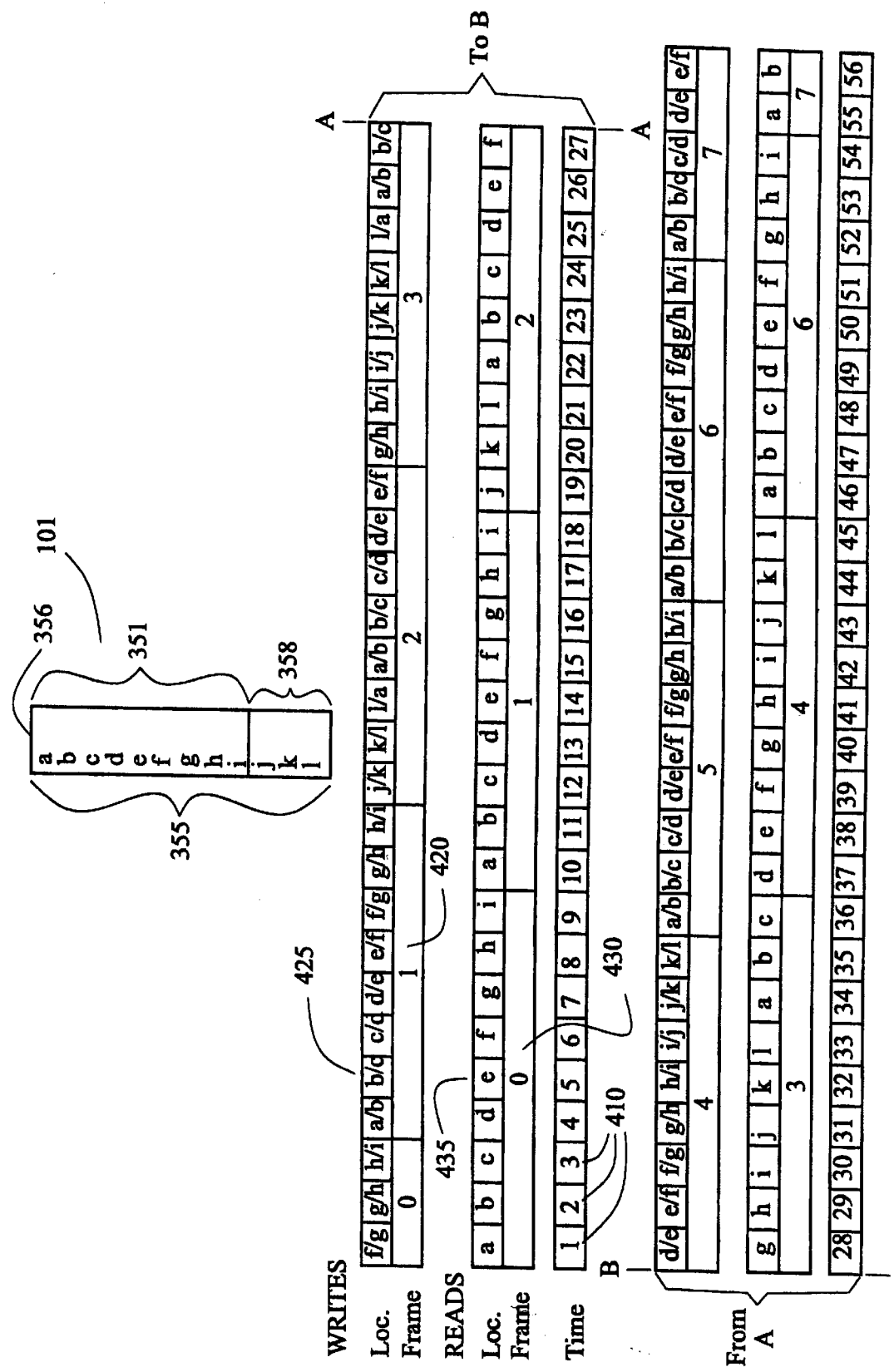
FIG. 4 is a diagram showing the timing relationships for the situation wherein writes to LCD memory are occurring faster than reads therefrom.

FIG. 4 is an illustrative example showing the operation of the present system 100 when the incoming video frame write rate is faster than the LCD frame read rate. In this example, LCD memory 101 has a total capacity of one and one-third (4/3) video frames, and Z is equal to 3. Time is represented by segments 410 of arbitrary but equal time length, running from t=1 to t=56. For the purpose of this example it is assumed that it takes 8 time segments to write one frame and 9 time segments to read one frame. Therefore, frame writes are occurring ⅑ faster than frame reads. LCD memory 101 is divided into 12 even segments α through l, collectively comprising extended buffer 355 which holds a full video frame. Memory segments α—i correspond to single frame buffer 351, and segments j—l correspond to extension buffer 358. The segments (α—l) utilized by specific write and read operations are shown along rows 425 and 435, respectively, and the frames 112 into and from which video data is written and read are respectively indicated along rows 420 and 430.

As can be seen from FIG. 4, when initial memory segment α of frame no. 0 is starting to be read at time t=1, the incoming video data is filling memory segments f/g, i.e., the frame write operation has almost completed filling frame 0. Memory segments separated by a '/', (e.g., 'f/g') indicate that, during a given time segment 410, video data is being written to parts of two adjacent memory segments. This is due to the fact that, in the present example, a single memory segment read operation takes exactly one time segment 410, and a write operation takes ⅑th less time. Therefore, in a given time segment, the write operation fills ⅑ more than a single memory segment, and thus must necessarily occupy parts of two memory segments.

At time t=1, when the read operation for frame no. 0 is beginning (at memory segment α), the incoming video data is filling (writing to) frame 0 at segments f/g. At time t=10, when the read operation for frame no. 1 is beginning (again, at memory segment α), the incoming video data has almost completed filling frame 1, at segments g/h. By time t=9, the read operation for frame 0 has been completed at memory segment i, at which time the write operation has filled memory segments f/g in frame 1. It can be seen from FIG. 4 that, as each successive LCD frame is read, the incoming video write address more closely approaches the LCD read address, since the writes are occurring faster than the reads. In this example, it is assumed that by the time the read operation for frame 1 is beginning, the incoming video write address is within N lines of the LCD frame address. Therefore wrap-around mode is initiated at t=12, using the entire extended buffer 355. The writing of incoming frame no. 1 is completed at t=11, but instead of beginning the next frame write operation at the top of memory 356, writing of the new frame (no. 2) begins where the last frame ended. Therefore, at t=12, incoming video data is written into memory segments j/k, in extension buffer 358. The frame read operations then track the write operations beginning at frame 1. Note that the read operation for frame 1 starts back at memory segment α, because the beginning of previously written frame 1 is located at segment α. Frame 1 is completely read at t=18, and at t=19, the read operation continues to track the previously written data by reading frame 2, which starts at memory segment j, in extension buffer 358.

Since Z=3 in this example, video data continues to be written using the entire extended buffer 355 for a total of 3 frames. Therefore, at write frame 5, which was written 3 frames subsequent to write frame 2 (where wrap-around mode was initiated), system 100 terminates wrap-around mode because the write and read addresses are spread sufficiently (i.e., greater than N lines) apart. Frame read operations continue to track the previously written frames through extended buffer 355 until read frame 4 is completed, at t=45. At t=46, the read operations resume at memory segment α, at the top of memory 356. Note that at t=46, the video data in memory segment α is being read from write frame 6. Write frame 5 is skipped because of the disparity between the write and read rates. This 'skipped' frame is not noticeable because the LCD frame refresh rate is typically 60 Hz. That is, the display discontinuity of occasionally excluding a 'skipped' frame of 1/60 second in duration is undetectable to the human eye. After write frame no. 5 and read frame no. 4 are processed, each subsequent frame is written and read starting at the top of memory 356 and using only single frame buffer 351, until the write/read address spacing again becomes sufficiently close to require that wrap-around mode be resumed.

A situation opposite of that described in the previous example is one wherein the LCD frame reads are occurring faster than the incoming video writes. The present system 100 handles the buffering for this case in the same general manner as described above. In this situation, wrap-around mode is again set when the spacing between the frame write and read addresses is less than N lines. Furthermore, as in the previous example, the frame write and read operations are performed in wrap-around mode for Z frames before normal single frame buffer mode is resumed. The result is that, eventually, a single frame of video data is read twice to re-esatablish proper separation between the video write and read addresses.

It is to be understood that the claimed invention is not limited to the description of the preferred embodiment, but encompasses other modifications and alterations within the scope and spirit of the inventive concept. Although the system of the present invention has been described in the context of LCD-type displays, the present system could function with any type of display unit which receives video input asynchronously with respect to the display sync rate.

We claim:

1. A method for controlling the reading from and writing to dual-port memory used as a buffer for storing digital video data to be displayed on a raster scanned display, wherein the video data is written to a write address in said memory and is read from a read address in said memory, and wherein the video data is received asynchronously with respect to the display rate of the raster scanned display, the method comprising the steps of:

partitioning said memory into an extended buffer including a single frame buffer capable of storing one frame of the video data, and an extension buffer for storing additional said video data, wherein said extension buffer is a contiguous extension of said single frame buffer;

determining a number of lines of separation in said memory between a present said read address and a present said write address;

writing the video data to said extended buffer, in response to a situation wherein said separation is not more than a predetermined number of said lines;

writing the video data to said single frame buffer, in response to a situation wherein said separation is more than said predetermined number of lines, and reading the video data for a most recently completed written frame.

2. The method of claim 1, wherein said extension buffer has a capacity of at least one third of a said frame of video data.

3. The method of claim 1 wherein said predetermined number of lines is determined by multiplying a total number of said lines in said frame by the absolute value of a percentage difference between a video data receive rate and said display rate.

4. The method of claim 1, wherein:

when said wrap-around mode is set, said video data is written to memory addresses extending sequentially through said single frame buffer from a first end thereof, through said extension buffer, and wrapping back to said first end of said single frame buffer.

5. The method of claim 1, comprising the additional steps of:

initializing a wrap counter when said buffer wrap-around mode is set; and incrementing said wrap counter each time a write sync signal is received;

wherein the step of terminating said buffer wrap-around mode is performed only after said wrap counter equals a predetermined maximum value.

6. The method of claim 5, wherein said predetermined maximum value is an integer having a value between 2 and 5, inclusive.

7. A method for controlling the reading from and writing to dual-port memory used as a buffer for storing digital video data to be displayed on a raster scanned display, the video data being written to a write address in said memory and being read from a read address in said memory, wherein the video data is received asynchronously with respect to the display rate of the raster scanned display, the method comprising the steps of:

(a) partitioning said memory into an extended buffer including a single frame buffer capable of storing one frame of the video data, and an extension buffer for storing additional said video data, wherein said extension buffer is a contiguous extension of said single frame buffer;

(b) receiving a write frame sync signal;

(c) determining a number of lines of separation in said memory between a present said read address and a present said write address;

(d) in response to a situation wherein said separation is not more than a predetermined number of said lines:

if buffer wrap-around mode is set,
writing the video data to said extended buffer; and
reading the video data from said extended buffer;

if said buffer wrap-around mode is not set,
setting said buffer wrap-around mode;
continuing to read the video data from said single frame buffer; and
writing the video data to said extended buffer space;

(e) in response to a situation wherein said separation is more than said predetermined number of lines:

if said buffer wrap-around mode is set,
terminating said buffer wrap-around mode; and
processing the video data by writing to and reading from said extended buffer;

if said buffer wrap-around mode is not set,
processing the video data by writing to and reading from said single frame buffer.

8. The method of claim 7, wherein said extension buffer has a capacity of at least one third of a said frame of video data.

9. The method of claim 7, wherein said predetermined number of lines is determined by multiplying a total number of said lines in said frame by the absolute value of a percentage difference between a video data receive rate and said display rate.

10. The method of claim 7, wherein:
when said wrap-around mode is set, said video data is written to memory addresses extending sequentially through said single frame buffer from a first end thereof, through said extension buffer, and wrapping back to said first end of said single frame buffer.

11. The method of claim 7, comprising the additional steps of:
initializing a wrap counter when said buffer wrap-around mode is set; and
incrementing said wrap counter each time a write sync signal is received;
wherein the step of terminating said buffer wrap-around mode is performed only after said wrap counter equals a predetermined maximum value.

12. The method of claim 11, wherein said predetermined maximum value is an integer having a value between 2 and 5, inclusive.

13. A system for managing video data to be displayed on a raster scanned video display device having dual-port memory connected thereto, wherein said data is written to a write address in said memory, and is read to said display device from a read address in said memory, wherein said memory includes a frame buffer for storing one frame of the video data, and an extension buffer, contiguous to said frame buffer, for storing additional said video data, the system comprising:
address compare logic for generating a minimum spacing signal when said write address is separated from said read address by a minimum spacing;
wrap counter logic for generating a wrap mode inhibit signal in response to simultaneously receiving said minimum spacing signal and a write sync signal, and for suppressing said wrap mode inhibit signal in absence of said minimum spacing signal, wherein said wrap mode inhibit signal is suppressed until a predetermined number of said write sync signals have been received;
gate logic for generating a counter reset signal in response to simultaneously receiving said minimum spacing signal, said wrap mode inhibit signal and said write sync signal;
a write address counter for incrementing said write address and for initializing said write address in response to said counter reset signal;
field delay logic for initializing said read address in response to simultaneously receiving said counter reset signal and a read sync signal, if said counter reset signal was received subsequent to the previous said write sync signal; and
a read address counter for incrementing said read address, and for initializing said read address in response to a signal from said field delay logic.

14. The system of claim 13, wherein said wrap counter logic causes said write address counter to initialize said write address when said write sync signal is detected, if said minimum spacing signal is detected and said wrap mode inhibit signal is being generated, otherwise said wrap counter logic allows said write address counter to continue incrementing from its present position.

15. The system of claim 13, wherein said raster scanned video display device is an LCD display.

16. A system for managing video data to be displayed on a raster scanned video display device having dual-port memory connected thereto, wherein said data is written to a write address in said memory, and is read to said display device from a read address in said memory, wherein said memory includes a frame buffer for storing one frame of the video data, and an extension buffer, contiguous to said frame buffer, for storing additional said video data, the system comprising:
address compare means for generating a minimum spacing signal when said write address is separated from said read address by a minimum spacing;
wrap counter means for generating a wrap mode inhibit signal in response to simultaneously receiving said minimum spacing signal and a write sync signal, and for suppressing said wrap mode inhibit signal in absence of said minimum spacing signal, wherein said wrap mode inhibit signal is suppressed until a predetermined number of said write sync signals have been received;
gate means for generating a counter reset signal in response to simultaneously receiving said minimum spacing signal, said wrap mode inhibit signal and said write sync signal;
a write address counter for incrementing said write address and for initializing said write address in response to said counter reset signal;
field delay means for initializing said read address in response to simultaneously receiving said counter reset signal and a read sync signal, if said counter reset signal was received subsequent to the previous said write sync signal; and
a read address counter for incrementing said read address, and for initializing said read address in response to a signal from said field delay means.

17. The system of claim 16, wherein said wrap counter means causes said write address counter to initialize said write address when said write frame signal is detected, if said minimum spacing signal is detected and said wrap mode inhibit signal is being generated, otherwise said wrap counter means allows said write address counter to continue incrementing from its present position.

18. The system of claim 16, wherein said predetermined number of said write sync signals is an integer between 2 and 5, inclusive.

19. The system of claim 16, wherein said minimum spacing is determined by multiplying a total number of said lines in said frame by the absolute value of a percentage difference between a rate at which said video data is received and a rate at which said video data is displayed on said display device.

20. The system of claim 16, wherein said predetermined number of said write sync signals is equal to 3.

* * * * *